United States Patent [19]

Matsuyama et al.

[11] Patent Number: 4,877,650

[45] Date of Patent: * Oct. 31, 1989

[54] METHOD FOR FORMING DEPOSITED FILM

[75] Inventors: Jinsho Matsuyama, Nagahama; Yutaka Hirai, Hikone; Masao Ueki, Urayasu; Akira Sakai, Nagahama, all of Japan

[73] Assignee: Canon Kabushiki Kaisha, Tokyo, Japan

[ * ] Notice: The portion of the term of this patent subsequent to Oct. 10, 2006 has been disclaimed.

[21] Appl. No.: 31,133

[22] Filed: Mar. 30, 1987

[30] Foreign Application Priority Data

Mar. 31, 1986 [JP] Japan .................................. 61-73091
Mar. 31, 1986 [JP] Japan .................................. 61-73094

[51] Int. Cl.$^4$ ............................................. C23C 16/00
[52] U.S. Cl. .................................. 427/248.1; 427/255; 427/255.1; 427/255.2; 427/255.3; 427/255.4; 427/255.7
[58] Field of Search .................. 427/248.1, 255, 255.1, 427/255.2, 255.3, 255.4, 255.7

[56] References Cited

U.S. PATENT DOCUMENTS 4,217,374  8/1980  Ovshinsky et al. ............... 427/248.1
4,226,898 10/1980  Ovshinsky et al. .................... 427/39
4,504,518  3/1985  Ovshinsky et al. .................... 427/38
4,522,663  6/1985  Ovshinsky et al. .................... 427/39
4,568,626  2/1986  Ogawa .................................. 427/38
4,657,777  4/1987  Hirooka et al. ....................... 427/39

FOREIGN PATENT DOCUMENTS

2148328  5/1985  United Kingdom ............. 427/248.1

Primary Examiner—Norman Morgenstern
Assistant Examiner—Sadie Childs
Attorney, Agent, or Firm—Fitzpatrick, Cella, Harper & Scinto

[57] ABSTRACT

A method for forming a deposited film comprises effecting a step (a) and a step (b) at least one time, the step (a) being introduction of a starting material (A) which is either one of a gaseous starting material for formation of a deposited film or a gaseous halogenic oxidizing agent having the property of oxidative action on said gaseous starting material into a film forming space in which a substrate for film formation is arranged to have said starting material (A) adsorbed onto the surface of said substrate to form an adsorbed layer (I) and the step (b) being the introduction of a starting material (B) which is the other of said gaseous starting material and said gaseous halogenic oxidizing agent into said film forming space, thereby causing surface reaction on said adsorbed layer (I) to occur to form a deposited film (i).

33 Claims, 3 Drawing Sheets

METHOD FOR FORMING DEPOSITED FILM

BACKGROUND OF THE INVENTION

1. Field of the Invention

This invention relates to a method for formation of a deposited film, which is useful for the preparation of a functional film, particularly a semiconductive deposited film being useful for uses such as semiconductor device, electronic device such as optical input sensor device for optical image inputting device, photosensitive device for electrophotography, etc.

2. Description of the Related Art

Hitherto, for functional films, particularly amorphous or crystalline semiconductor films, individually suitable film forming methods have been employed from the standpoint of desired physical characteristics, uses, etc.

For example, for formation of silicon deposited films such as amorphous or polycrystalline nonsingle crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been used as the optimum method and industrialized.

However, the reaction process in formation of a silicon deposited film according to the plasma CVD method which has been generalized in the prior art is considerably complicated as compared with the CVD method of the prior art, and its reaction mechanism involves many ambiguous points. Also, there are a large number of parameters for formation of a deposited film such as substrate temperature, flow rate and flow rate ratio of the introduced gases, pressure during formation, high frequency power, electrode structure, structure of the reaction vessel, speed of evacuation, plasma generating system, etc. On a count of the use of a combination of such a large number of parameters, the plasma may sometimes become unstable state, whereby marked deleterious influences were exerted frequently on the deposited film formed. Besides, the parameters characteristic of the device must be selected for each device and therefore it has been difficult to generalize the production conditions under the present situation.

Also, in the case of the plasma CVD method, since plasma is generated by high frequency or microwave, etc., in the film forming space in which a substrate on which film is formed is arranged, electrons or a number of ion species generated thereby may give damages to the film in the film forming process to cause lowering in film quality or unevenness of film quality. Moreover, the conditions for crystallization of deposited film are narrow and therefore it has been deemed to be difficult to produce polycrystalline deposited films having stable characteristics.

Whereas, for formation of an epitaxial deposited film such as of silicon, germanium, the group II-VI and the group III-V semiconductors, etc., there have been used the gas phase epitaxy and the liquid phase epitaxy as classified broadly (generally speaking, the strict definition of epitaxy is to grow another single crystal on a single crystal, both having the same single crystal axes, but here epitaxy is interpreted in a broader sense and it is not limited to the growth onto a single crystal substrate).

The liquid phase epitaxy is a method for the deposition of a semiconductor crystal on a substrate by dissolving a starting material for semiconductor at an elevated temperature to a supersaturated state in a solvent of a metal which is molten to a liquid and cooling the solution. According to this method, since the crystals are prepared under the state most approximate to thermal equilibrium among various epitaxy techniques, crystals having high perfectness can be obtained, but on the other hand, mass productivity is poor and also the surface state is bad. For such reasons, in an optical device which requires an epitaxial layer which is thin and also uniform in thickness, problems are accompanied such as yield in device production, or influences exerted on the device characteristics, etc., and therefore this method is not frequently used.

On the other hand, the gas phase epitaxy has been attempted by physical methods such as the vacuum vapor deposition method, the sputtering method, etc., or chemical methods such as hydrogen reduction of a metal chloride, or thermal pyrolysis of an organic metal or a metal hydride. Among them, the molecular ray epitaxy which is a kind of the vacuum vapor deposition method is a dry process under ultra-high vacuum, and therefore high purification and low temperature growth of crystals are possible, whereby there is the advantage that composition and concentration can be well controlled to give a relatively even deposited film. However, in addition to an enormous cost required for the film forming device, the surface defect density is great, and no effective method for controlling directionality of molecular ray has been developed, and also enlargement of area is difficult and mass productivity is not so good. Due to such many problems, it has not been industrialized yet.

The hydrogen reduction method of a metal chloride or the thermal pyrolysis method of an organic metal or a metal hydride are generally called the halide CVD method, the hydride CVD method, the MO-CVD method. For these methods, since the film forming apparatus can be manufactured with relative ease and also metal chloride, metal hydrides, and organic metals being the starting materials, those with high purities are now readily available, they have been studied widely at the present time and application for various devices has been investigated.

However, in these methods, it is required to heat the substrate to at least an elevated temperature at which the reduction reaction or thermal pyrolysis reaction can occur and therefore the scope of choice of the substrate material is limited, and also contamination with impurities such as carbon or halogen, etc., is liable to be caused if decomposition of the starting material is insufficient, thus having the drawback that controllability of doping is poor. Also, depending on the application use of the deposited film, it is desired to effect mass production having reproducibility with full satisfaction of enlarged area, uniformization of film thickness as well as uniformness of film quality and yet at a high speed film formation, under the present invention. However, no technique which enables mass production while maintaining practical characteristics satisfying such demands has been established yet.

Also, as another method, it has been practiced to remove lattice strain, excite rearrangement of atoms or to sweep out impurity atoms from a specific region by heating the film formed. This technique has been widely known as "anneal" and, if substances are observed little more macroscopically, this technique will bring about crystallization of amorphous material, enlargement of polycrystalline or microcrystalline domain, uniformization of orientation direction (crystal axis), changes in composition, etc.

Whereas, since common anneal treatment is the step taken after formation of a film to a predetermined film thickness, its effect is not so great when applied to a material having an atomic arrangement greatly different from a desired atomic arrangement. Also, even when practiced during film formation, not much effect can be expected since there are some cases where the film forming process itself is greatly different from desired one such as those where an amorphous material will be formed although it is intended to constitute a crystalline material. This will inevitably lead to accomplishment of the anneal process by maintenance of the temperature at an extremely high level, whereby remarkable restrictions are imposed on selection of substrate materials, performances of film forming devices, constitution of bulk production device, etc.

SUMMARY OF THE INVENTION

A principal object of the present invention is to provide a method for forming a deposited film which is easy in management of film quality simultaneously with effecting energy saving and can give an amorphous or crystalline deposited film having uniform characteristics over a large area and excellent semiconductive characteristics.

Another object of the present invention is to provide a method for forming a deposited film which is excellent in productivity and mass productivity and can form simply and efficiently an amorphous or crystalline deposited film having high quality and excellent physical characteristics such as electrical, optical, and semiconductive characteristics, etc.

According to the present invention, there is provided a method for forming a deposited film comprising effecting a step (a) and a step (b) at least one time, the step (a) being introduction of a starting material (A) which is either one of a gaseous starting material for formation of a deposited film or a gaseous halogenic oxidizing agent having the property of oxidative action on said gaseous starting material into a film forming space in which a substrate for film formation is arranged to have said starting material (A) adsorbed onto the surface of said substrate to form an adsorbed layer (I) and the step (b) being the introduction of a starting material (B) which is the other of said gaseous starting material and said gaseous halogenic oxidizing agent into said film forming space, thereby causing surface reaction on said adsorbed layer (I) to occur and form a deposited film (I).

DETAILED DESCRIPTION OF THE PREFERRED EMBODIMENTS

In the method for forming deposited film of the present invention, the gaseous starting material to be used for formation of a deposited film (hereinafter called "gaseous starting material") is a material which receives oxidation action through contact with a gaseous halogenic oxidizing agent (hereinafter called "halogenic oxidizing agent"), and may be selected suitably as desired depending on the kind, the characteristics, uses, etc. of the desired deposited film. In the method of the present invention, the above gaseous starting material and the halogenic oxidizing agent may be gaseous when introduced, and may be either gaseous, liquid or solid under ordinary state. In the case when the gaseous starting material or the halogenic oxidizing agent is liquid or solid under ordinary state, a carrier gas such as Ar, He, $N_2$, $H_2$, etc., is used and bubbling is effected optionally with heating to introduce either one of the gaseous starting material and the halogenic oxidizing agent in the gaseous state into the film forming space to form an adsorbed layer on the substrate, and then the other material is introduced in the gaseous state.

During this operation, the introducing pressure of the above gaseous starting material or the halogenic oxidizing agent may be set by controlling the flow rate of the carrier gas or the vapor pressure of the gaseous starting material and the halogenic oxidizing agent. When the gaseous starting material or the halogenic oxidizing agent is a gas under normal state, it can be also introduced as diluted with a carrier gas such as Ar, He, $N_2$, $H_2$, etc., if necessary.

As the gaseous starting material to be used in the method of the present invention, for example, for obtaining a deposited film of silicon belonging to the group IV of the periodic table, there may be employed straight and branched chain silane compounds, cyclic silane compounds, etc., as effective ones.

As one capable of being such gaseous starting material, specifically, examples of the straight chain silane compounds may include $Si_nH_{2n+2}$ (n=1, 2, 3, 4, 5, 6, 7, 8), examples of branched chain silane compounds $SiH_3$-$SiH(SiH_3)SiH_2SiH_3$, and examples of cyclic silane compounds $Si_nH_{2n}$ (n=3, 4, 5, 6), etc.

Of course, these silicon compounds may be used not only as one kind, but also as a mixture of two or more kinds.

The halogenic oxidizing agent to be used in the method of the present invention is made gaseous when introduced into the film forming space and at the same time has the property of exerting oxidation action effectively on the gaseous starting material for formation of deposited film only through contact therewith, and halogenic gases such as $F_2$, $Cl_2$, $Br_2$, $I_2$, ClF, etc., may be employed as effective ones.

Either one of these gaseous starting materials or halogenic oxidizing agent is first introduced in the form of a gas with desired flow rate and feeding pressure given into a film forming space in which a substrate for formation of a deposited film is arranged to form an adsorbed layer on the substrate and then the other is introduced after desired time with desired flow rate and feeding pressure given, whereby the both are collided against each other on the surface of the above adsorbed layer to cause a surface chemical reaction to occur, whereby the above halogenic oxidizing agent exerts oxidation reaction on the above gaseous starting material to form a deposited film on the substrate surface. Such a deposited film forming process of the present invention can proceed with better efficiency and with more saving of energy, whereby a deposited film having desired good physical characteristics over the whole film surface can be formed at a lower substrate temperature than in the prior art.

According to another aspect of the above present invention, there is provided a method for forming deposited film of the present invention, which comprises the formation of a deposited film without through the plasma reaction by use of the halogenic oxidizing agent in place of the plasma CVD method of the prior art which forms plasma discharging by permitting discharging energy, etc, to act on the starting gas for formation of the deposited film, and by doing so, it has the advantage that no bad influence by etching or abnormal discharging, etc., during film formation will be received.

According to a further aspect of the present invention, there is provided a method for forming a deposited film, which comprises the formation of a very thin a deposited film on a substrate by adsorbing either one of the gaseous starting material and the halogenic oxidizing agent having the oxidation action on the starting material onto the substrate surface to form an adsorbed layer before introduction of the other, and by doing to there is the advantage that a deposited film with uniform film thickness and film quality can be obtained.

According to a still further aspect of the present invention, there is provided a method for forming deposited film, which utilizes the redox reaction of the gaseous starting material containing an element which becomes the constituent elements of the deposited film with the halogenic oxidizing agent and requires no high temperature for deposition, and therefore there is no disturbance of the structure by heat, and no heating installation during production and no expense accompanied with running thereof are required, whereby the device can be made lower in cost.

And, it becomes possible to select the substrate material from a wide scope of materials without depending on heat resistance.

Also, the method for forming deposited film of the present invention forms a deposited film according to the reaction between the gaseous starting material and the halogenic oxidizing agent which progresses as concerned with the adsorbed molecules, and therefore enlargement of area is possible not depending on the shape and the size of the substrate, and at the same time the starting materials employed may be very small in amounts, whereby the film forming space can be made smaller to improve dramatically the yield.

Also, according to the method for forming deposited film of the present invention having the constitution as described above, energy saving during formation of deposited film can be effected and at the same time management of film quality can be easily done, whereby it becomes possible to form a good crystalline deposited film having uniform film quality and characteristics over a large area. Further, it is possible to obtain efficiently an amorphous or crystalline film which is excellent in productivity and mass productivity, of high quality and also excellent in various characteristics such as electrical, optical, semiconductive characteristics, etc.

In the method of the present invention, so that the deposited film forming process may proceed smoothly and a film having desired physical characteristics of high quality may be formed, as the film forming factors, the kinds and combinations of the starting material for formation of deposited film and the halogenic oxidizing agent, the pressure during the reaction, the flow rate, the inner pressure in the film forming space, the kind of the substrate, the pressure during adsorption, the flow rates of the gases, the adsorption temperature and the film forming temperature (substrate temperature and atmosphere temperature) may be selected suitably as desired. These film forming factors are related organically, and they are not determined individually but determined respectively under mutual relationships. In the method of the present invention, the process of adsorption and reaction of the gaseous starting material for formation of deposited film and the halogenic oxidizing agent to be introduced into the film forming space may be determined suitably as desired in the relationship with the film forming factors concerned among the film forming factors as mentioned above.

The conditions in the step of forming an adsorbed layer on the substrate in the method for forming deposited film of the present invention are suitably set.

In adsorption of gas molecules onto a solid surface, there exists intramolecular forces, and the chemical adsorption with valence energy is greater in its intramolecular force than the physical adsorption with dispersion energy (corresponding to Van der Waals force).

Also, while physical adsorption is liable to become a multi-layer adsorption, a chemical adsorption is a monomolecular layer adsorption, and therefore for controlling deposition of a homogeneous thin film, the adsorption should also finally be preferably in the form of the chemical adsorption.

However, in the present invention, physical adsorption and chemical adsorption of gas molecules may be considered to be related with each other complicatedly in the processes from the formation of an adsorbed layer to the formation of a deposited film by a reaction with said adsorbed layer, and the form of adsorption is not necessarily limited. On the other hand, the factors which determine the adsorption state ma include the kind of the adsorbed molecules, the kind of the solid surface and the surface state, and further temperature and pressure as controlling factors, and it is at least necessary to determine these controlling factors so that the reaction may be carried out to give a desired deposited film.

That is to say, if the pressure in the vacuum chamber is too low in the course from adsorption to reaction, desorption from the state of physical adsorption is liable to occur, while if the temperature is too high, dissociating adsorption from the state of chemical adsorption is liable to occur, and therefore the reaction process suitable for a desired deposited film must be selected.

In one cycle for formation of a deposited film of the present invention, which comprises the step [a] for the formation of an adsorbed layer and the step [b] of the reaction of said adsorbed layer with a starting material, as the steps prior to uniform formation of a desired deposited film on the substrate surface, there are the following steps. That is, there is the step of introducing the starting material (A) into the film forming space and permitting it in a suitable amount adsorbed on the substrate to form an adsorbed layer (the first step: Step [a]). And, there is further the step of permitting the starting material (A) to remain in the adsorbed layer and discharging superfluous starting material (A) (the second step). In these steps, the pressures may be set suitably for the above reasons, and the pressure in the first step [a] may be preferably higher for sufficient progress of adsorption, preferably $1 \times 10^{-7}$ to 10 Torr, more preferably $1 \times 10^{-4}$ to Torr.

The pressure in the second step may be preferably lower for discharging superfluous starting material (A), preferably $1 \times 10^{-10}$ to 1 Torr, more preferably $1 \times 10^{-9}$ to $1 \times 10^{-2}$ Torr.

Further, one cycle for formation of deposited film of the present invention comprises subsequent to these steps the step of introducing the starting material (B) into the film forming space to cause the surface reaction with the adsorbed layer on the substrate to form a deposited film (the third step: Step [B]), and next the step of discharging the byproducts formed at this time (the fourth step), and the pressure during the reaction in the third step may be preferably higher in order to enhance the probability of the contact between the starting materials (A) and B, but the final value is determined suitably as desired in view of the reactivity.

The pressure in the third step may be preferably $1 \times 10^{-8}$ to 10 Torr, more preferably $1 \times 10^{-6}$ to 1 Torr. The pressure in the fourth step may be preferably $1 \times 10^{-12}$ to 1 Torr.

In the present invention, the said steps [a] and [b] are carried out at least one time. However, in some cases, the steps [a] and [b] may be repeated in a desired number of times in this order. At this case, the periods for the steps [a] and [b] . may be equal or unequal in each cycle.

In the method of the present invention formation of a crystalline deposited film such as Si, GaAs, etc. of good quality, it is preferable to use an amorphous substrate such as Si, GaAs etc., but by selecting suitably the film forming conditions, it is also possible to use an amorphous substrate such as glass, quartz glass, etc., or an insulating substrate such as ceramics, etc., and form a desired deposited film on such substrate.

The substrate temperature (Ts) during film formation may be set suitably depending on the kind of the deposited film to be formed and the kind of the substrate used.

In the present invention, a deposited film of better quality can be obtained by further including the step described below. That is, the atoms on the substrate surface are excited prior to formation of the above adsorbed layer, thereby releasing unnecessary impurity atoms weakly adsorbed or increasing adsorbability of the substrate surface to promote formation of the adsorbed layer, or uniforming the arrangement of the first layer (the film formed by the step (b) in the first cycle) to grow a polycrystal having a large grain size. Alternatively, a film can be prepared so that the deposited film to be newly laminated may have crystalline orientation by exciting the atoms constituting the deposited film as each single layer of the deposited film is formed (each time the step (b) is completed) to uniformize or reconstitute the arrangement of the atoms.

In the present invention, as the method for exciting the atoms in the substrate or the deposited film there may be employed the methods such as heat-ray irradiation by a halogen lamp, a flash lamp, etc., emitting heat-ray, heating by a heat-generating means such as strip heater, etc., energy beam irradiation of electron beam, etc., light beam irradiation by a laser such as excimer laser of $CO_2$ laser or YAG laser etc. and also irradiation of electromagnetic wave such as AC electrical field, RF, $\mu$ wave, electromagnetic induction, imparting of sonication vibration, etc. In some cases, it is also possible to excite the atoms only at a desired region by scanning a converged beam.

The method for forming a deposited film including the additional step as described above, namely the combination of the chemical reaction between the gaseous starting material and the halogenic oxidizing agent on the substrate surface and the thermal exciting means from the growth side of the film is not a mere combination of the film forming step with heat annealing step, but it has the following effect. That is, (1) it guarantees clean surface prior to adsorption by vibrating thermally the atoms on the surface to be formed which is the adsorbed layer forming surface (namely the substrate surface or the surface on which a thin film has been already formed) to thereby release unnecessary impurity atoms unnecessarily adsorbed; (2) it controls unbonded bonds or double bonds possessed by the surface atoms by thermal vibration of the atoms on the above adsorbed layer forming surface to increase or decrease adsorbability to the adsorbed layer forming atoms, thus enabling selection of the two dimensional arrangement of the adsorbed layer; (3) it can realize effective two dimensional arrangement which cannot be accomplished only by adsorption by vibrating thermally the atoms in the adsorbed layer or the deposited single layer formed through the chemical reaction with the adsorbed layer at a temperature by far lower than the temperature given to a bulk material; (4) it permits the chemical reaction between the gaseous starting material and the halogenic oxidizing agent to proceed efficiently and yet preponderantly at the portion thermally vibrated by vibrating thermally the atoms in the adsorbed layer; (5) it aids in integration in the three-dimensional direction of the regions with different morphology, namely the regions with different characteristics by restricting the regions to be thermally vibrated in the planar direction or the film forming direction of the film; (6) rearrangement energy can be made smaller in the whole film heating after film formation, or in other words, the heating temperature can be made lower, because the film is prepared by accumulation of chemical bonds; (7) when a polycrystalline or signal crystal film is constituted by rearrangement from polycrystals with smaller domains than them, a deposited film with relatively greater domain can be prepared initially, and therefore enlargement of domain can be easily done to give a film with great mobility, etc.

As can be also seen from these effects, control of the growing atoms is one specific feature of the above described method of the present invention, and this is intended to be accomplished by imparting exciting energy to the atoms not from the supporting side of the substrate, but from the growing side.

In the above described method of the present invention, so that the deposited film forming process may proceed smoothly and a film having desired physical characteristics of high quality may be formed, other than the film forming factors mentioned above, the inner pressure in the film forming space, the kind of the substrate, the pressure during adsorption, the amount of energy for exciting vibration of atoms for controlling adsorbability, reactivity and rearrangement characteristic and its timing may be selected suitably as desired. These film forming factors are related organically, and they are not determined individually but determined respectivity under mutual relationships.

As described above, since the method for forming a deposited film including the thermal excitation step according to the present invention gives thermal vibration to the atoms at the adsorption sites or the monatomic layer or further a plural number of atomic layers formed, bonding and rearrangement between film forming atoms or release of impurity atoms can be done effectively with a small energy which is necessary and sufficient through the synergic effect of the chemical energy possessed by the above reactive substances and the imparted heat energy which is the lattice atoms vibration. Consequently, there is the advantage that a film of good quality can be formed with a production equipment with small running cost, leading to enlargement of the device field to be applied to or cost down of the device itself.

Further, since atomic arrangement and bonding strength concerning film formation are controlled by thermal excitation of these atoms, it becomes possible to perform selective thermal excitation to thereby impart desired characteristics only to the necessary portion of the device while imparting other semiconductor characteristics to the non-heat-excited portion or different heat-excited portion, particularly enabling realization of a constitution for integrating the device in a large area with ease.

The method of the present invention is described in more detail by use of Examples, but the present invention is not limited by these Examples.

Figure 1:
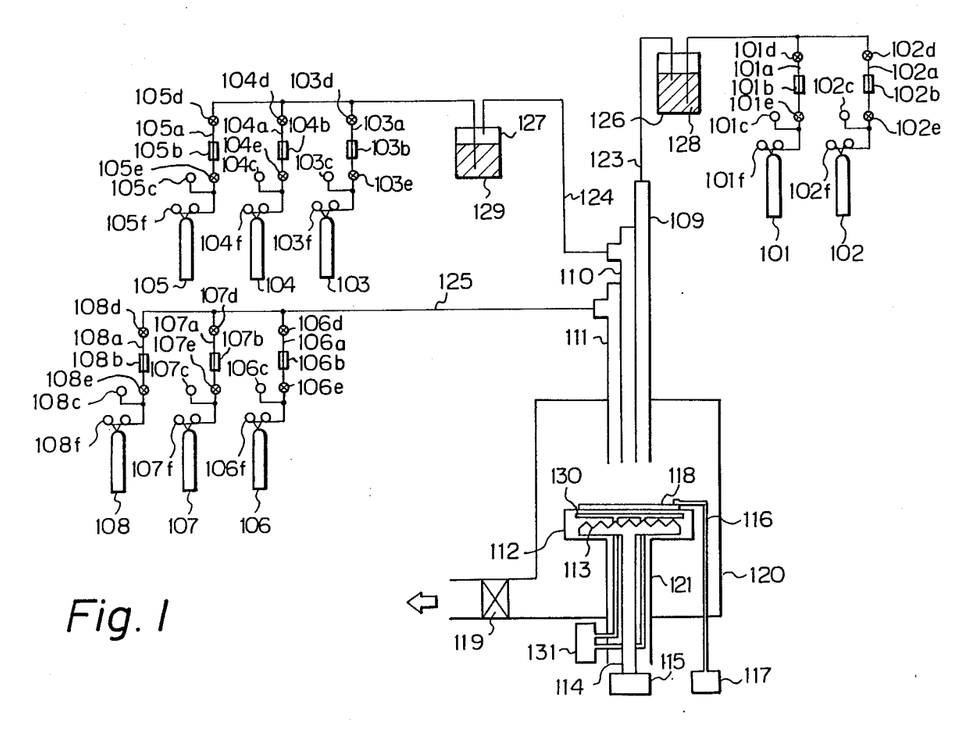
FIG. 1 is a schematic illustration of the film forming apparatus for embodying the method for forming a deposited film of the present invention.

FIG. 1 shows one Example of a preferable apparatus for embodying the method for formation of a deposited film of the present invention.

The apparatus for forming deposited film shown in FIG. 1 is classified broadly into the three of the main device, the discharging system and the gas feeding system.

The main device is provided with a film forming space.

101 to 108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber, having a structure such that a pipeline for introduction of gas is provided at the upper portion and a reaction space is formed downstream of the pipeline, and also having a structure such that a film forming space provided with a substrate holder 112 may be formed so that a substrate 118 may be placed as opposed to the gas introducing inlet of said pipeline. The pipeline for introduction of gas has a three-tubular arrangement structure, having from the innerside a first gas introducing pipe 109 for introducing gases for the gas bombs 101 and 102, a second gas introducing pipe 110 for introducing the gases from the gas bombs 103–105, and a third gas introducing pipe 111 for introducing the gases from the gas bombs 106–108.

Feeding of the gases from the bombs to the respective introducing pipes is done through the gas feeding pipelines 123–125, respectively.

The respective gas introducing pipes, the respective gas feeding pipelines, and the vacuum chamber 120 are evacuated to vacuum by a vacuum evacuating device not shown through the main vacuum valve 19.

The substrate 118 can be set freely at any desired position from the respective gas introducing pipes and the activation energy irradiating surface by moving the substrate holder 112 vertically and in the direction of X and Y.

In the case of the method of the present invention, the distance between the substrate and the gas introducing inlet of the gas introducing pipe may be determined appropriately in view of the kinds of the deposited film to be formed, its desired characteristics, gas flow rates, the inner pressure in the vacuum chamber, etc., but it should preferably several mm to 20 cm, more preferably about 5 mm to 15 cm.

130 is a cooling pipe for making the gas molecules of the starting material A easily adsorbable onto the substrate 118, and it is connected to the flow rate controller 131. Cooling can be also used during film formation or after film formation other than in the first and the second steps in which adsorption is effected.

113 is a heater for heating the substrate, which heats the substrate 118 to an appropriate temperature during film formation, preheats the substrate 118 before film formation, and further, after film formation, heats the film for annealing.

To the heater 113 for heating the substrate is fed power from the power source 115 through the wire 114.

116 is a thermocouple for measuring the temperature of the substrate (Ts) and is connected electrically to the temperature display apparatus 117.

126 and 127 are bubblers for liquid starting materials, and used with filling of liquid starting materials 128 and 129 for formation of deposited film, respectively. When the starting materials for formation of deposited film are gases under ordinary state, it is not necessary to use bubblers for liquid starting materials Example 1

By means of the film forming device shown in FIG. 1, a deposited film according to the method of the present invention was prepared as described below.

The SiH$_4$ gas filled in the bomb 101 was fed at a flow rate of 40 sccm through the gas introducing pipe 109, the F$_2$ gas filled in the bomb 106 at a flow rate of sccm and the He gas filled in the bomb 107 at a flow rate 120 sccm through the gas introducing pipe 111 into the vacuum chamber 120. In this Example, the bubblers and 127 for liquid starting materials are not used.

For the substrate 118, a quartz glass of 40 cm×40 cm was used, and the distance between the gas introducing inlet 111 and the substrate was set at 10 cm. The substrate (Ts) was set at 300° C.

First, the vacuum chamber 120 was evacuated under sufficient baking by means of an evacuating device not shown to $5 \times 10^{-9}$ Torr. The SiH$_4$ filled in the bomb 101 was permitted to flow at a flow rate of 3 sccm through the gas introducing pipe 109 into the vacuum chamber 120 for 5 sec under the state maintained at an evacuating speed of 0.1 mTorr/sec by controlling the evacuation valve 119. Subsequently, the valve 101d *was closed to stop feeding of the SiH$_4$ gas*, and the state controlled to a vacuum degree of 0.01 Torr by opening the evacuation valve 119 was maintained for 6 sec.

The F$_2$ gas (diluted to 10% with He) filled in the bomb 107 was introduced at 4 sccm through the gas introducing pipe 111 into the vacuum chamber 120. The evacuation rate at this time was controlled to 0.8 mTorr/sec by controlling the evacuating valve 119, and after this state was maintained for 5 sec, the valve 107a was closed to stop feeding of $F_2$ gas, and the state controlled to a vacuum degree of 0.004 Torr by opening the evacuation valve 119 was maintained for 6 sec.

By repeating the operation as described above for 3400 times, an a-Si:H silicon deposited film with a thickness of about 5200 Å was obtained.

For the deposited film sample obtained, crystallinity of the deposited film was evaluated by the X-ray diffraction method and the electron beam diffraction method, whereby it was confirmed to be an amorphous silicon film.

When the surface state of each sample was observed by a scanning type electron microscope, the smoothness was good without wavy pattern, etc., and the film thickness irregularity t was ±5% or less. Also, concerning electrical characteristics, a deposited film having a mobility which is greater by one cipher than the amorphous silicon prepared by the prior art was obtained stably over a large area.

Example 2

By use of the deposited film forming device shown in FIG. 1 similarly as in Example 1, a polycrystalline Si of good quality was formed as described below.

First, the vacuum chamber 120 was evacuated under sufficient baking by means of an evacuation device not shown to $5 \times 10^{-9}$ Torr. The $SiH_4$ gas filled in the bomb 101 was permitted to flow for 0.2 sec at a flow rate of 4 sccm into the vacuum chamber 120 through the gas introducing pipe 109 under the state maintained at an evacuation rate of 0.1 mTorr/sec by controlling the evacuation valve 119. Subsequently, the valve 101d was closed to stop feeding of the $SiH_4$ gas, and the evacuation valve 119 was opened and the state controlled to a vacuum degree of 10 mTorr was maintained for 1 sec.

The $F_2$ gas (diluted to 10% with He) filled in the bomb 107 was introduced at 5 sccm through the gas introducing pipe 111 into the vacuum chamber 120. The evacuation rate at this time was made 0.8 mTorr/sec by controlling the evacuation valve 119, and after this state was maintained for 0.2 sec, the valve 107a was closed to stop feeding of the $F_2$ gas, and the state controlled to vacuum of 4 mTorr was maintained for 2 sec by opening the evacuation valve 119.

As the substrate 118, a quartz glass of 10 cm × 10 cm was employed, and the substrate temperature was 340° C. Also the distance between the gas introducing inlet 111 and the substrate was set at 5 cm. By repeating this operation, a Si film with a thickness of about 6600 Å was obtained.

For the respective deposited film samples obtained, crystallinity of the deposited film was evaluated by the X-ray diffraction method and the electron beam diffraction method, whereby they were confirmed to be polycrystalline silicon films. Further, the grain size of the polycrystalline silicon determined by Scherrar method was found to be about 1.5 μm. There was substantially no variance in crystal grain sizes over the whole surface of the substrate.

When the surface state of the sample was observed by a scanning type electron microscope, the smoothness was good without wavy pattern, etc., and the film thickness irregularity t was ±5% or less. Also, when the mobility of the polycrystalline Si deposited film on the glass substrate was measured by the Van der Pavw method to be 240 (cm/V·sec), $6 \times 10^{-6}$ (S·cm$^{-1}$)

Example 3

By means of the film forming device shown in FIG. 1, a deposited film was prepared as described below.

The $SiH_4$ gas filled in the bomb 101 was fed at a flow rate of 40 sccm through the gas introducing pipe 109, the $F_2$ gas filled in the bomb 106 at a flow rate of 60 sccm and the He gas filled in the bomb 107 at a flow rate of 120 sccm through the gas introducing pipe 111 into the vacuum chamber 120. In this Example, the bubblers 126 and 127 for liquid starting materials are not used.

For the substrate 118, a quartz glass of 40 cm × 40 cm was used, and the distance between the gas introducing inlet 111 and the substrate was set at 10 cm. The substrate temperature (Ts) was set at 300° C.

First, the vacuum chamber 120 was evacuated under sufficient baking by means of an evacuating device not shown to $5 \times 10^{-9}$ Torr. The $SiH_4$ filled in the bomb 101 was permitted to flow at a flow rate of 3 sccm under the state maintained at $3 \times 10^{-2}$ Torr by controlling the evacuation valve 119. Subsequently, the valve 101d was closed t stop feeding of the $SiH_4$ gas, and the state controlled to a vacuum degree of $1 \times 10^{-3}$ Torr by opening the evacuation valve 119 was maintained for 10 sec.

The $F_2$ gas (diluted to 10% with He) filled in the bomb 107 was introduced at 4 sccm through the gas introducing pipe 111 into the vacuum chamber 120. The inner pressure in the chamber at this time was controlled to $6 \times 10^{-2}$ mTorr by controlling the evacuation valve 119, and after this state was maintained for 5 sec, the valve 107a was closed to stop feeding of $F_2$ gas, and the state controlled to a vacuum degree of $1 \times 10^{-3}$ Torr by opening the evacuation valve 119 was maintained for 10 sec.

By repeating the operation as described above for 3000 times, an amorphous Si deposited film containing the state of μc-Si with a thickness of about 5000Å was obtained.

Figure 2:
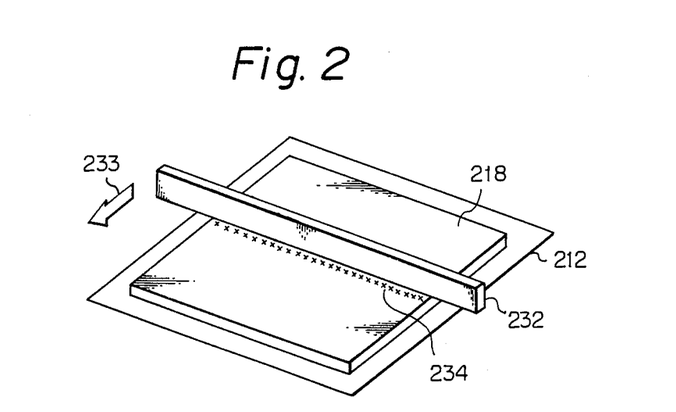
FIG. 2 is a schematic perspective view of the heating apparatus used in Examples of the present invention.

Then, without breaking vacuum, the movable heater 232 provided in the chamber as shown in FIG. 2 was heated to 1300° C., and the substrate holder 212 was heated to 600° C., and the movable heater was delivered at a movement speed of 1 mm/sec with a distance of the movable heater of 2mm from the film surface, the atom heat-excited region 234 was formed, and a polycrystalline Si film having a means grain size of 800Å was formed at a temperature than usual simultaneous with removal of F atoms slightly remained.

Example 4

Figure 3:
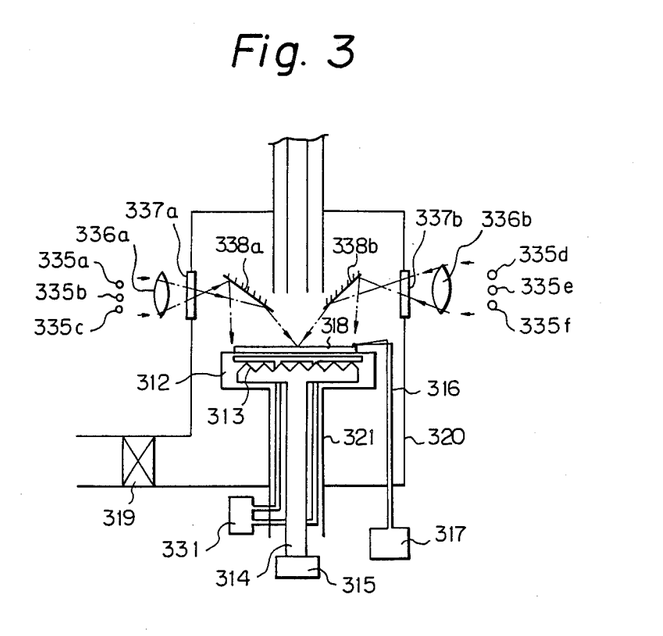
FIG. 3 is a schematic illustration of a film forming apparatus prepared by modifying the apparatus shown in FIG. 1 to be provided with a radiant light heating means.

A heat excitation means by use of a halogen lamp was externally equipped on the device shown in FIG. 1. This is shown in FIG. 3. The heat rays from the halogen lamps 335a-c, 335d-f were converged at the lenses 336a, b, and changed in their optical path by the mirrors 338a, b provided in the chamber 320 through the quartz windows 337a, b so as to irradiate substantially uniformly the quartz substrate 318.

By use of this device system, film formation was conducted in the same manner as in Example 3. However, in the step of stopping feeding of the $F_2$ gas and maintaining the state controlled at a vacuum degree of $1 \times 10^{-3}$ Torr by opening the evacuation valve 319 for 10 sec, film formation was effected by irradiating the surface with this halogen lamp for 1 sec. The temperature elevation by Ts when the quartz substrate was irradiated with the halogen lamp for 10 seconds was 250° C.

In this film forming system, also a deposited film of 5000Å was obtained, and it was found to be μc-Si with a mean grain size of 200Å.

Example 5

Figure 4:
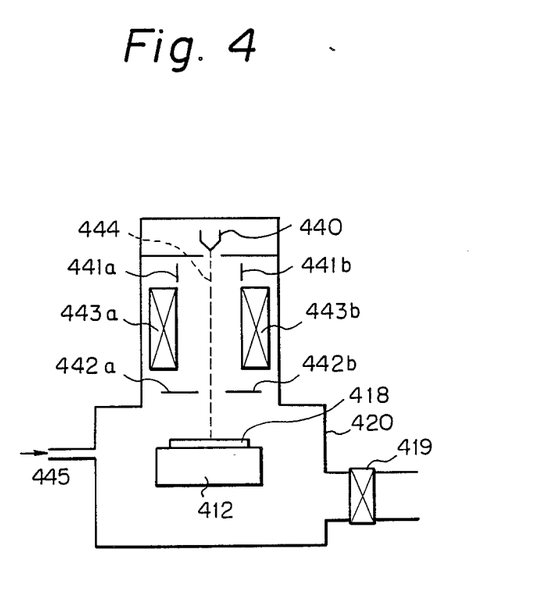
FIG. 4 is a schematic illustration of an electron beam heating apparatus used in Examples of the present invention.

The device shown in FIG. 1 provided with an electron beam source as shown in FIG. 4 was utilized. The electrons emitted fom the electron gun 440 irradiate an accelerated converged beam of electrons on the substrate by means of the deflecting electrodes 443a, b and the control electrode 441a, b and 442a, b. Beam diameter of 50 μm, acceleration voltage of 10 kV and current of 2 mA are realized in a vacuum degree of $10^{-10}$ Torr.

By use of a 1 inch square quartz as the substrate, luster scanning irradiation was effected with the above electron beam on the substrate at 1cm/sec to modify the substrate surface. By this, the substrate surface changed from hydrophilic to hydrophobic, whereby the amount of the gas adsorbed became markedly increased. When film formation was continued according to the same process as in Example 3, a poly-Si film exceeding a grain size of 1000Å was obtained.

Example 6

The halogen lamp in FIG. 3 was changed to an ArF excimer laser with a pulse width of 50 nsec and a beam density of 100 mJ/cm². When a 1 inch square glass substrate was scanned with a laser beam of 193 nm in the chamber maintained internally at a vacuum degree of $10^{-7}$ Torr under the flow of $H_2$ at 50 sccm, only the glass surface layer of the substrate was elevated in temperature and also reduced with $H_2$, whereby the weakly bonded portion changed and, when film formation was conducted according to the same method as in Example 3, an extremely higher crystalline μc-Si film was obtained at an average Ts of 350° C.

Example 7

By use of the same heat excitation source as in Example 6, and according to the same process as in Example 3, beam scanning was conducted every one cycle to effect rearrangement of the respective layers. The film obtained was found to be a polycrystalline film with an extremely great domain on 1 inch quartz.

The method for forming deposited film of the present invention can form a deposited film only by contacting a gaseous starting material with a gaseous halogenic oxdizing agent, and has the advantage of requiring particularly no reaction exciting energy from the outside. Accordingly, it becomes possible to lower the substrate temperature. Also, since extremely thin deposited films of several Å are laminated, any desired amorphous or crystalline deposited film can be formed. Further, simultaneously with saving of energy, it is possible to obtain a crystalline deposited film having uniform film quality and characteristics over a large area with easy management of the film quality. Further, a crystalline film excellent in productivity, bulk productivity, having high quality with excellent electrical, optical semiconductive properties can be obtained with ease.

We claim:

1. A method for forming a deposited film using starting materials (A) and (B) comprising:
   introducing one of the starting materials into a film forming space having a substrate therein;
   allowing said one starting material to adsorb onto said surface of said substrate to thereby form an adsorption layer; and
   introducing the other starting material into said film forming space, to thereby cause a surface reaction on said adsorption layer to form a deposited film; said starting material (A) being a gaseous starting material for forming a deposited film; and starting material (B) being a gaseous halogenic oxidizing agent capable of having an oxidative action on said starting material (A).

2. The method according to claim 1, wherein said absorption layer is formed by having said gaseous halogenic oxidizing agent adsorbed onto said substrate surface.

3. The method according to claim 1, wherein said absorption layer is formed having said gaseous starting material for formation of a deposited film onto said substrate surface.

4. The method according to claim 1, further comprising:
   feeding one of said starting materials (A) or (B) into the film forming space and allowing said one starting material to adsorb onto the surface of said deposited film to thereby form a second adsorption layer;
   feeding the other starting material into said film forming space to thereby cause a surface reaction on said second adsorption layer to form a second deposited film.

5. The method according to claim 1, wherein said deposited film is amorphous.

6. The method according to claim 1, wherein said deposited film is crystalline.

7. The method according to claim 1, wherein said gaseous starting material is a chain silane compound.

8. The method according to claim 7, wherein said chain silane compound is a straight chain silane compound.

9. The method according to claim 8, wherein said straight chain silane compound is represented by the general formula $Si_nH_{2n+2}$ (n is an integer of 1 to 8).

10. The method according to claim 7, wherein chain silane compound is a branched chain silane compound.

11. The method according to claim 1, wherein said gaseous starting material is a silane compound having a cyclic structure of silicon.

12. The method according to claim 1, wherein said gaseous halogenic oxidizing agent includes a halogenic gas.

13. The method according to claim 1, wherein said gaseous halogenic oxidizing agent includes fluorine gas.

14. The method according to claim 1, wherein said gaseous halogenic oxidizing agent includes chlorine gas.

15. The method according to claim 1, wherein said gaseous halogenic oxidizing agent is a gas containing fluorine atoms as the constituent.

16. A method for forming a deposited film using starting materials (A) and (B), comprising:
   introducing one of the starting materials into a film forming space having a substrate therein;
   allowing said starting material to adsorb onto the surface of said substrate to thereby form an adsorption layer; and
   introducing the other starting material into said film forming space, to thereby cause a surface reaction on said adsorption layer to form a deposited film; said starting material (A) being a gaseous starting material for forming a deposited film; and starting material (B) being a gaseous halogenic oxidizing agent capable of having an oxidative action on said starting material (A); and directing heat toward the film growth side of said substrate.

17. The method according to claim 16, wherein said heating step is started prior to introducing one of said starting materials into said film forming space.

18. The method according to claim 17, wherein said heating step excites vibration of atoms in the adsorption layer.

19. The method according to claim 17, wherein said heating step excites vibration of atoms in said deposed film.

20. The method according to claim 16, wherein said adsorption layer is formed by having said gaseous halogenic oxidizing agent adsorbed onto said substrate surface.

21. The method according to claim 16, wherein said adsorption layer is formed by having said gaseous starting material for formation of said deposited film adsorbed onto said substrate surface.

22. The method according to claim 16, further comprising:

feeding one of said starting materials (A) or (B) into the film forming space and allowing said one starting material to adsorb onto the surface of said deposited film to thereby form a second adsorption layer;

feeding the other starting material into said film forming space to thereby cause a surface reaction on said second adsorption layer to form a second deposited film.

23. The method according to claim 16, wherein said deposited film is amorphous.

24. The method according to claim 16, wherein said deposited film is crystalline.

25. The method according to claim 16, wherein said gaseous starting material is a chain silane compound.

26. The method according to claim 25, wherein said chain silane compound is a straight chain silane compound.

27. The method according to claim 26, wherein said straight chain silane compound is represented by the general formula $Si_nH_{2n+2}$ (n is an integer of 1 to 8).

28. The method according to claim 25, wherein said chain silane compound is a branched chain silane compound.

29. The method according to claim 16, wherein said gaseous starting material is a silane compound having a cyclic structure of silicon.

30. The method according to claim 16, wherein said gaseous halogenic oxidizing agent includes fluorine gas.

31. The method according to claim 16, wherein said gaseous halogenic oxidizing agent includes fluorine gas.

32. The method according to claim 16, wherein said gaseous halogenic oxidizing agent includes chlorine gas.

33. The method according to claim 16, wherein said gaseous halogenic oxidizing agent is a gas containing fluorine atoms as the constituent.

* * * * *

UNITED STATES PATENT AND TRADEMARK OFFICE
CERTIFICATE OF CORRECTION

PATENT NO. : 4,877,650
DATED : October 31, 1989
INVENTOR(S) : JINSHO MATSUYAMA, ET AL.

It is certified that error appears in the above-identified patent and that said Letters Patent is hereby corrected as shown below:

IN [57] ABSTRACT

Line 15, "deposited film (i)." should read --deposited film.--.

COLUMN 1

Line 45, "a count" should read --account--.

COLUMN 3

Line 61, "deposited film (I)" should read --deposited film--.

COLUMN 4

Line 25, Close up right margin.
    Line 26, Close up left margin.

COLUMN 5

Line 19, "without through" should read --without--.
    Line 23, "etc," should read --etc.,--.
    Line 30, "a" (second occurrence) should be deleted.
    Line 35, "to" should read --so--.

COLUMN 6

Line 32, "exists" should read --exist--.
    Line 49, "ma" should read --may--.

UNITED STATES PATENT AND TRADEMARK OFFICE
CERTIFICATE OF CORRECTION

PATENT NO. : 4,877,650
DATED : October 31, 1989
INVENTOR(S) : JINSHO MATSUYAMA, ET AL.

Page 2 of 4

It is certified that error appears in the above-identified patent and that said Letters Patent is hereby corrected as shown below:

COLUMN 7

Line 21, "Step [B])," should read --Step [b],--.
Line 35, "At" should read --In--.
Line 36, "[b].may" should read --[b] may--.
Line 37, "invention formation" should read --invention, for formation--.
Line 46, "the" (second occurrence) should be deleted.
Line 47, "the" (second occurrence) should be deleted.

COLUMN 8

Line 3, "CO₂ laser" should read --$CO_2$ laser--.
Line 15, "Close up right margin.
Line 16, Close up left margin.
Line 27, "two dimensional" should read --two-dimensional--.
Line 29, "two dimensional" should read --two-dimensional--.
Line 44, "(6) rearrangement" should read --(6) the rearrangement--.
Line 60, "above described" should read --above-described--.

COLUMN 9

Line 4, "respectivity" should read --respectively--.
Line 49, "101e-108e" should read --101e-108e--.

UNITED STATES PATENT AND TRADEMARK OFFICE
CERTIFICATE OF CORRECTION

PATENT NO. : 4,877,650
DATED : October 31, 1989
INVENTOR(S) : JINSHO MATSUYAMA, ET AL.

It is certified that error appears in the above-identified patent and that said Letters Patent is hereby corrected as shown below:

COLUMN 10

Line 4, "main vacuum valve 19." should read
--main vacuum valve 119.--.
Line 16, "preferably" should read --preferably be--.
Line 47, "sccm" should read --60 sccm--.
Line 48, "flow rate 120" should read
--flow rate of 120--.
Line 50, "bubblers" should read --bubblers 126--.
Line 58, Close up right margin.
Line 59, Close up left margin.
Line 63, Italics should be deleted.
Line 64, Italics should be deleted.

COLUMN 11

Line 38, ""valve 119" should read --valve 119--.

COLUMN 12

Line 2, "6X10$^{-6}$(S·cm$^{-1}$)" should read --6X10$^{-6}$(S·cm$^{-1}$).--.
Line 11, "120 sccm" should read --of 120 sccm--.
Line 24, "t stop" should read --to stop--.
Line 48, "means" should read --mean--.
Line 49, "temperature than" should read
--temperature lower than--.
Line 56, "Close up left margin.

UNITED STATES PATENT AND TRADEMARK OFFICE
CERTIFICATE OF CORRECTION

PATENT NO. : 4,877,650
DATED : October 31, 1989
INVENTOR(S) : JINSHO MATSUYAMA, ET AL.

Page 4 of 4

It is certified that error appears in the above-identified patent and that said Letters Patent is hereby corrected as shown below:

COLUMN 13

Line 11, Close up right margin.
Line 12, Close up left margin.

COLUMN 14

Line 13, "absorption layer" should read --adsorption layer--.
Line 17, "absorption layer" should read --adsorption layer--.

COLUMN 15

Line 15, "deposed" should read --deposited--.

Signed and Sealed this

Twenty-fourth Day of September, 1991

Attest:

HARRY F. MANBECK, JR.

Attesting Officer

Commissioner of Patents and Trademarks